(12) United States Patent
Troost et al.

(10) Patent No.: US 7,116,403 B2
(45) Date of Patent: Oct. 3, 2006

(54) LITHOGRAPHIC APPARATUS AND DEVICE MANUFACTURING METHOD

(75) Inventors: Kars Zeger Troost, Waalre (NL); Karel Diederick Van Der Mast, Helmond (NL)

(73) Assignee: ASML Netherlands B.V, Veldhoven (NL)

( * ) Notice: Subject to any disclaimer, the term of this patent is extended or adjusted under 35 U.S.C. 154(b) by 61 days.

(21) Appl. No.: 10/876,772

(22) Filed: Jun. 28, 2004

(65) Prior Publication Data
US 2005/0286035 A1 Dec. 29, 2005

(51) Int. Cl.
G03B 27/54 (2006.01)
G03B 27/42 (2006.01)
G03B 27/72 (2006.01)

(52) U.S. Cl. .............................. 355/67; 355/53; 355/71
(58) Field of Classification Search ................... 355/52, 355/53, 55, 67–71; 250/548; 356/399–401; 347/239; 359/618
See application file for complete search history.

(56) References Cited

U.S. PATENT DOCUMENTS

| | | | |
|---|---|---|---|
| 5,048,968 A * | 9/1991 | Suzuki ....................... 356/401 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A * | 10/2000 | Johnson ....................... 355/67 |
| 6,177,980 B1 | 1/2001 | Johnson | |
| 6,407,766 B1 * | 6/2002 | Ramanujan et al. ......... 347/239 |
| 6,424,404 B1 * | 7/2002 | Johnson ....................... 355/44 |
| 6,687,041 B1 | 2/2004 | Sandstrom | |
| 6,747,783 B1 | 6/2004 | Sandstrom | |
| 6,778,257 B1 * | 8/2004 | Bleeker et al. ................ 355/67 |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

WO WO 98/33096 7/1998
WO WO 98/38597 9/1998

* cited by examiner

*Primary Examiner*—Henry Hung Nguyen
(74) *Attorney, Agent, or Firm*—Sterne, Kessler, Goldstein & Fox P.L.L.C.

(57) ABSTRACT

Lithographic apparatus providing a patterned beam of radiation in which radiation that is linearly polarized in a first direction has a first pattern and radiation that is linearly polarized in an orthogonal direction has a second pattern.

14 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

It is known to illuminate different parts of a pattern to be produced on a substrate with different illumination settings. For example, a desired illumination for a pattern consisting of elongate, relatively thin, features is so-called dipole illumination. In this arrangement, illuminating radiation is arranged in a pupil plane, such that the radiation is confined to portions of the pupil plane that are set apart from an optical axis along a line in the pupil plane that is parallel to the elongate features of the pattern to be illuminated.

However, patterns to be illuminated typically include not only elongate features parallel to a first direction, but also elongate features perpendicular to this direction. In this situation, typically the pattern is divided into two exposures: (1) the first exposure illuminating a sub-pattern including the elongate features parallel to a first direction and illuminated using the appropriately orientated dipole illumination and (2) the second exposure illuminating the perpendicularly orientated elongate features using dipole illumination orientated appropriately for those features. The disadvantage of such an arrangement is that two exposures are required for each complete pattern. Therefore, the exposure time is doubled, reducing the throughput of the apparatus.

A compromise solution has also been used, in which the complete pattern is illuminated using quadrupole illumination. This is illumination in which the radiation in the pupil plane is arranged as a combination of two dipole exposures, each optimized for illuminating patterns of elongate features perpendicular to one another. This arrangement avoids the loss of throughput for the apparatus, but the quality of the image projected onto the substrate is not as good as can be achieved with separate dipole illumination exposures. Additionally, it is desirable to use increasingly high NA (Numerical Aperture) when imaging patterns onto the substrate because this can further increase the quality of the pattern imaged onto the substrate. However, as the NA increases a grazing angle of the radiation projected onto the substrate also increases. Consequently, as the NA increases, the proportion of the radiation that is reflected from the substrate also increases. The reflected radiation is stray radiation that can affect other parts of the apparatus or reduce the quality of the pattern produced on the substrate if reflected back to the substrate. Furthermore, as the proportion of stray radiation increases, it is necessary to increase the intensity of the illumination radiation and/or increase the exposure time, thereby increasing the cost of the apparatus and/or reducing the throughput of the apparatus.

Therefore, what is needed is an improved arrangement for illuminating patterns and projecting them onto the substrate.

SUMMARY OF THE INVENTION

According to an embodiment of the present invention, there is provided a lithographic apparatus comprising an illumination system for supplying a projection beam of radiation, a radiation beam splitter for splitting the projection beam into first and second beams of radiation, a first array of individually controllable elements serving to impart the first beam with a first pattern in its cross-section, a second array of individually controllable elements serving to impart the second beam with a second pattern in its cross-section, a radiation beam combiner for combining the first and second patterned beams to form a combined patterned beam, a substrate table for supporting a substrate; and a projection system for projecting the combined patterned beam onto a target portion of the substrate. The portion of the combined patterned beam derived from the first patterned beam is substantially linearly polarized and the portion of the combined patterned beam derived from the second patterned beam is substantially linearly polarized, substantially orthogonal to the portion derived from the first patterned beam.

In this embodiment, a pattern to be projected onto the substrate can be divided into two sub-patterns set on the first and second arrays of individually controllable elements, which are them simultaneously imaged onto the substrate. In particular, elongate features in the pattern parallel to the given direction may be provided by the first array of individually controllable elements and elongate features perpendicular to the given direction may be provided by the second array of individually controllable elements. Therefore, illumination settings appropriate to the patterns set on each of the first and second arrays of individually controllable elements may be used. Furthermore, appropriate selection of the orientation of the linear polarization of the portions of the combined patterned beam may be used to reduce the reflection of the radiation from the substrate when the portion of the combined patterned beam is incident on the substrate at a high grazing angle.

In one example, the orientation of the linear polarization of the portion of the combined patterned beam derived from the first patterned beam is selected, such that the electric field of the portion of the beam of radiation lies in a plane that is perpendicular to a plane defined by the line along which the portion of the combined beam of radiation is projected onto the substrate (which is at an oblique angle to the substrate) and a line perpendicular to the substrate. The portion of the combined patterned beam derived from the second patterned beam may be arranged likewise. Consequently, the electric field of the radiation at the point at which it is incident on the substrate is parallel to the surface of the substrate. Therefore the reflection of the radiation from the substrate is minimized.

In one example, the radiation beam splitter is a polarizing cube. The portion of the projection beam of radiation supplied by the illumination system that is linearly polarized in a first direction is reflected in the polarizing cube to the first array of individually controllable elements, while the radiation in the projection beam that is linearly polarized in a second direction, orthogonal to the first direction is transmitted through the polarizing cube to the second array of individually controllable elements. The radiation from the illumination system can be divided into a portion that is linearly polarized in a first direction and a portion that is linearly polarized in a second direction without significant losses, such as might occur when dividing the projection beam of radiation into first and second beams of radiation using a non-polarizing beam splitter and/or when subsequently linearly polarizing the first and second beams of radiation or the first and second patterned beams of radiation.

In one example, the radiation beam splitter and the radiation beam combiner are a single optical element or group of components. Consequently, where reflective arrays of individually controllable elements are used, they may be illuminated telecentrically. Furthermore, the number of components required is reduced, potentially reducing the complexity of the apparatus.

In one example, a quarter wavelength plate may be located in the beam path of the first and/or second beams of radiation between the beam/combiner and the associated array of individually controllable elements. This is especially beneficial if the beam splitter/combiner is a polarizing cube because the radiation is appropriately directed through the polarizing cube.

In this example, the portion of the projection beam of radiation that is appropriately linearly polarized to be initially reflected in the polarizing cube is subsequently rotated by passing through the quarter wavelength plate twice (before and after being incident on the array of individually controllable elements) and subsequently, when it next enters the polarizing cube, it is transmitted through the polarizing cube. Similarly, the portion of the projection beam of radiation appropriately linearly polarized to be initially transmitted through the polarizing cube is subsequently rotated by its double passage through the associated quarter wavelength plate, and is therefore reflected in the polarizing cube when it enters for the second time. Therefore, the beams of radiation patterned by the two arrays of individually controllable elements exit the polarizing cube for the second time together, namely are combined into a single patterned beam, and reflection of radiation in the direction of the radiation source is minimized.

In one example, it is desirable to ensure that the optimal illumination of the two sub-patterns without increasing the complexity of the apparatus. In this example, the projection system is arranged to preserve the polarization of the components of the combined patterned beam of radiation. Furthermore, the projection system provides independent correction of chromatic errors in each of the portions of the combined pattered beam derived from the first and second patterned beams. For example, independent correction for portions of the combined patterned beam that are linearly polarized in orthogonal directions.

In one example, the illumination system may be arranged so that the radiation in a first part of the pupil plane is linearly polarized in a given direction and radiation in a second portion of the pupil plane is linearly polarized in a direction orthogonal to that in the first portion. Therefore, radiation in one portion of the pupil plane will be used to illuminate the first array of individually controllable elements and that in the second portion of the pupil plane is used to illuminate the second array of individually controllable elements. Accordingly, the illumination conditions of two different patterns set on the arrays of individually controllable elements can be independently set. In particular, radiation linearly polarized in a first direction may be arranged in two opposite quadrants of the pupil plane, desirably away from the optical axis, and radiation linearly polarized orthogonal to the given direction may be provided in the remaining two quadrants, again desirably away from the optical axis. Accordingly, each array of individually controllable elements receives dipole illumination because it is only illuminated by the radiation that is linearly polarized in a particular direction. Furthermore, the dipole illumination received by the first is appropriate for elongate pattern features at a different orientation than the features which are appropriately orientated on the second array of individually controllable elements for its dipole illumination. Accordingly, the illumination can be optimized for parts of the pattern containing elongate features parallel to a particular direction.

In another embodiment of the present invention there is provided a lithographic apparatus comprising an illumination system for supplying a projection beam of radiation, a patterning device for imparting the projection beam with a pattern in its cross-section, a substrate table for supporting a substrate, and a projection system for projecting the patterned beam onto a target portion of the substrate. The projection system comprises a polarizing cube for separating into first and second patterned sub-beams, respectively, radiation in the patterned beam that is substantially linearly polarized in a first direction and radiation in the patterned beam that is substantially linearly polarized in a second direction, substantially orthogonal to the first direction, first and second optical correction units for correcting the first and second patterned sub-beams, respectively, and a radiation beam combiner for combining the first and second corrected sub-beams to form a corrected patterned beam.

In this embodiment, independent corrections can be applied to components of the patterned beam that are linearly polarized in different directions. This is especially beneficial where, for example, differently polarized components of the patterned beam have followed different optical paths and therefore have been exposed to different errors.

In a further embodiment of the present invention, there is provided a device manufacturing method comprising the steps of providing a substrate, providing a projection beam of radiation using an illumination system, using a radiation beam splitter to split the projection beam into first and second beams of radiation, using a first array of individually controllable elements to impart the first beam with a first pattern in its cross-section, using a second array of individually controllable elements to impart the second beam with a second pattern in its cross-section, using a radiation beam combiner to combine the first and second patterned beams to form a combined patterned beam, and projecting the combined patterned beam of radiation onto a target portion of the substrate. The portion of the combined patterned beam derived from the first patterned beam is substantially linearly polarized; and the portion of the combined patterned beam derived from the second patterned beam is substantially linearly polarized, substantially orthogonal to the portion derived from the first patterned beam.

In a still further embodiment of the present invention, there is provided a device manufacturing method comprising the steps of providing a substrate, providing a projection beam of radiation using an illumination system, using patterning means to impart the projection beam with a pattern in its cross-section, and projecting the patterned beam onto a target portion of the substrate. The step of projecting the patterned beam onto the substrate includes using a polarized cube to separate into first and second patterned sub-beams, respectively, radiation in the patterned beam that is substantially linearly polarized in a first direction and radiation in the patterned beam that is substantially linearly polarized in a second direction, substantially orthogonal to the first direction, using first and second optical correction units to correct the first and second patterned sub-beams, respectively, and combining the first and second corrected sub-beams to form a corrected patterned beam.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 526 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
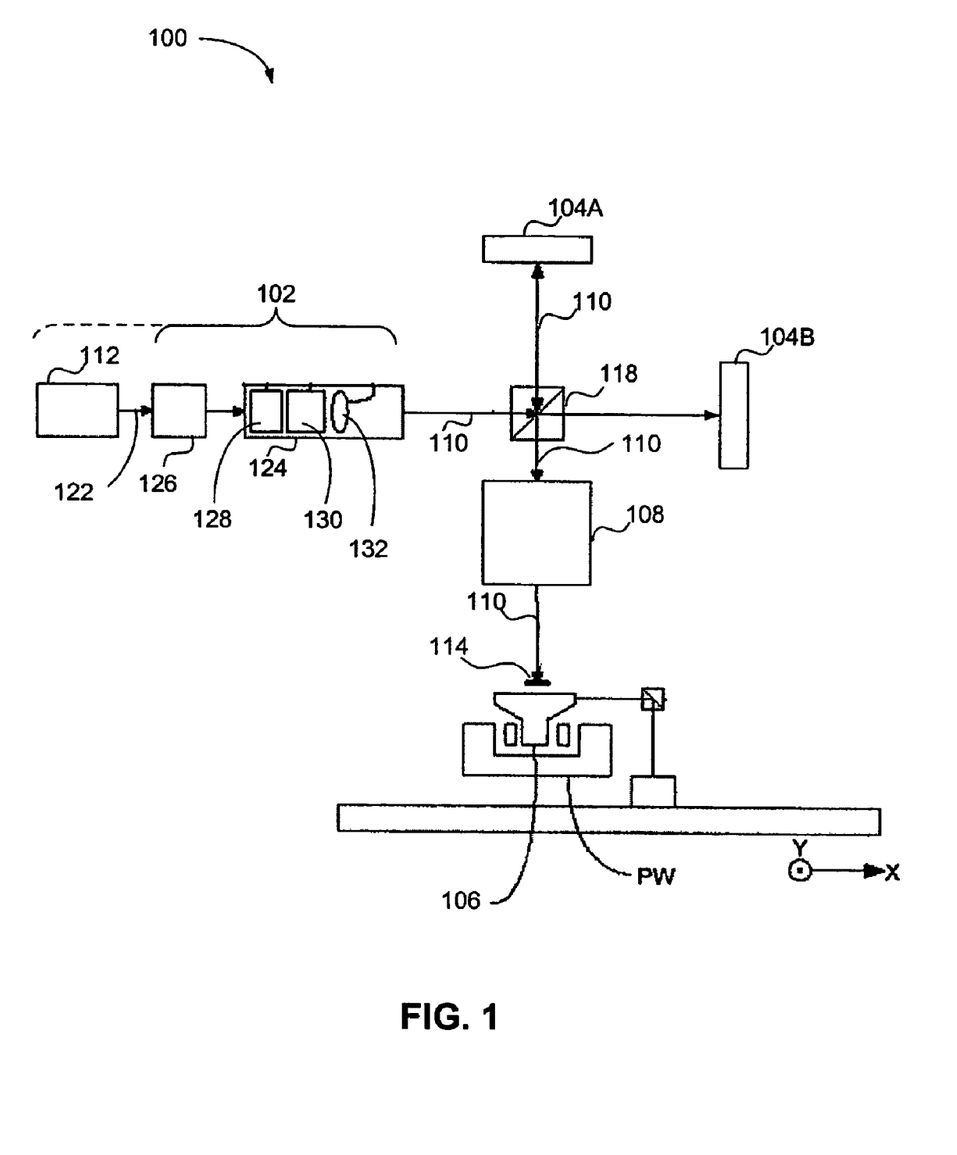
FIG. 1 depicts part of a lithographic apparatus, according to one embodiment of the present invention.

FIG. 1 schematically depicts a lithographic projection apparatus 100 according to an embodiment of the invention. Apparatus 100 includes at least a radiation system 102, first and second arrays of individually controllable elements 104A and 104B, respectively, an object table 106 (e.g., a substrate table), and a projection system ("lens") 108.

Radiation system 102 can be used for supplying a projection bean 510 of radiation (e.g., UV radiation), which in this particular case also comprises a radiation source 512.

First and second arrays of individually controllable elements 104A and 104B (e.g., a programmable mirror array) can be used for applying a pattern to projection beam 510. In general, the position of first and second arrays of individually controllable elements 104A and 104B can be fixed relative to projection system 108. However, in an alternative arrangement, at least one of first and second arrays of individually controllable elements 104A and 104B may be connected to a positioning device (not shown) for accurately positioning it with respect to projection system 108. As here depicted, individually controllable elements 104A and 104B are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 516 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of first and second arrays of individually controllable elements 104A and 104B onto substrate 114. Alternatively, projection system 108 may project images of secondary sources for which the elements of first and second arrays of individually controllable elements 104A and 104B act as shutters. Projection system 108 may also comprise a micro lens array (MLA) to form the secondary sources and to project microspots onto substrate 114.

Source 512 (e.g., an excimer laser) can produce a beam of radiation 522. Beam 522 is fed into an illumination system (illuminator) 524, either directly or after having traversed conditioning device 526, such as a beam expander 526, for example. Illuminator 524 may comprise an adjusting device 128 for setting the outer and/or inner radial extent (commonly referred to as σ-outer and σ-inner, respectively) of the intensity distribution in beam 522. In addition, illuminator 524 will generally include various other components, such as an integrator 530 and a condenser 132. In this way, projection beam 510 impinging on first and second arrays of individually controllable elements 104A and 104B has a desired uniformity and intensity distribution in its cross section.

It should be noted, with regard to FIG. 1, that source 512 may be within the housing of lithographic projection apparatus 100 (as is often the case when source 512 is a mercury lamp, for example). In alternative embodiments, source 512 may also be remote from lithographic projection apparatus 100. In this case, radiation beam 522 would be directed into apparatus 100 (e.g., with the aid of suitable directing mirrors). This latter scenario is often the case when source 512 is an excimer laser. It is to be appreciated that both of these scenarios are contemplated within the scope of the present invention.

Beam 510 subsequently intercepts first and second arrays of individually controllable elements 104A and 104B after being directing using beam splitter 118. Having been reflected by first and second arrays of individually controllable elements 104A and 104B, beam 510 passes through projection system 108, which focuses beam 510 onto a target portion 120 of the substrate 114.

With the aid of positioning device 516 (and optionally interferometric measuring device 134 on abase plate 136 that receives interferometric beams 138 via beam splitter 140), substrate table 106 can be moved accurately, so as to position different target portions 120 in the path of beam 510. Where used, the positioning device for first and second arrays of individually controllable elements 104A and 104B can be used to accurately correct the position of first and second arrays of individually controllable elements 104A and 104B with respect to the path of beam 510, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 510 may alternatively/additionally be moveable, while object table 106 and/or first and second arrays of individually controllable elements 104A and 104B may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 510. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 510 for use in resistless lithography.

The depicted apparatus 100 can be used in four preferred modes:

1. Step mode: the entire pattern on first and second arrays of individually controllable elements 104A and 104B is projected in one go (i.e., a single "flash") onto a target portion 120. Substrate table 106 is then moved in the x and/or y directions to a different position for a different target portion 120 to be irradiated by patterned projection beam 510.

2. Scan mode: essentially the same as step mode, except that a given target portion 120 is not exposed in a single "flash." Instead, first and second arrays of individually controllable elements 104A and 104B is movable in a given direction (the so-called "scan direction", e.g., the y direction) with a speed v, so that patterned projection beam 510 is caused to scan over first and second arrays of individually controllable elements 104A and 104B. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: first and second arrays of individually controllable elements 104A and 104B is kept essentially stationary and the entire pattern is projected onto a target portion 120 of substrate 114 using pulsed radiation system 102. Substrate table 106 is moved with an essentially constant speed such that patterned projection beam 510 is caused to scan a line across substrate 106. The pattern on first and second arrays of individually controllable elements 104A and 104B is updated as required between pulses of radiation system 102 and the pulses are timed such that successive target portions 120 are exposed at the required locations on substrate 114. Consequently, patterned projection beam 510 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on first and second arrays of individually controllable elements 104A and 104B is updated as patterned projection beam 510 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grey-scale printing.

Exemplary Patterning and Projection Systems

Figure 2:
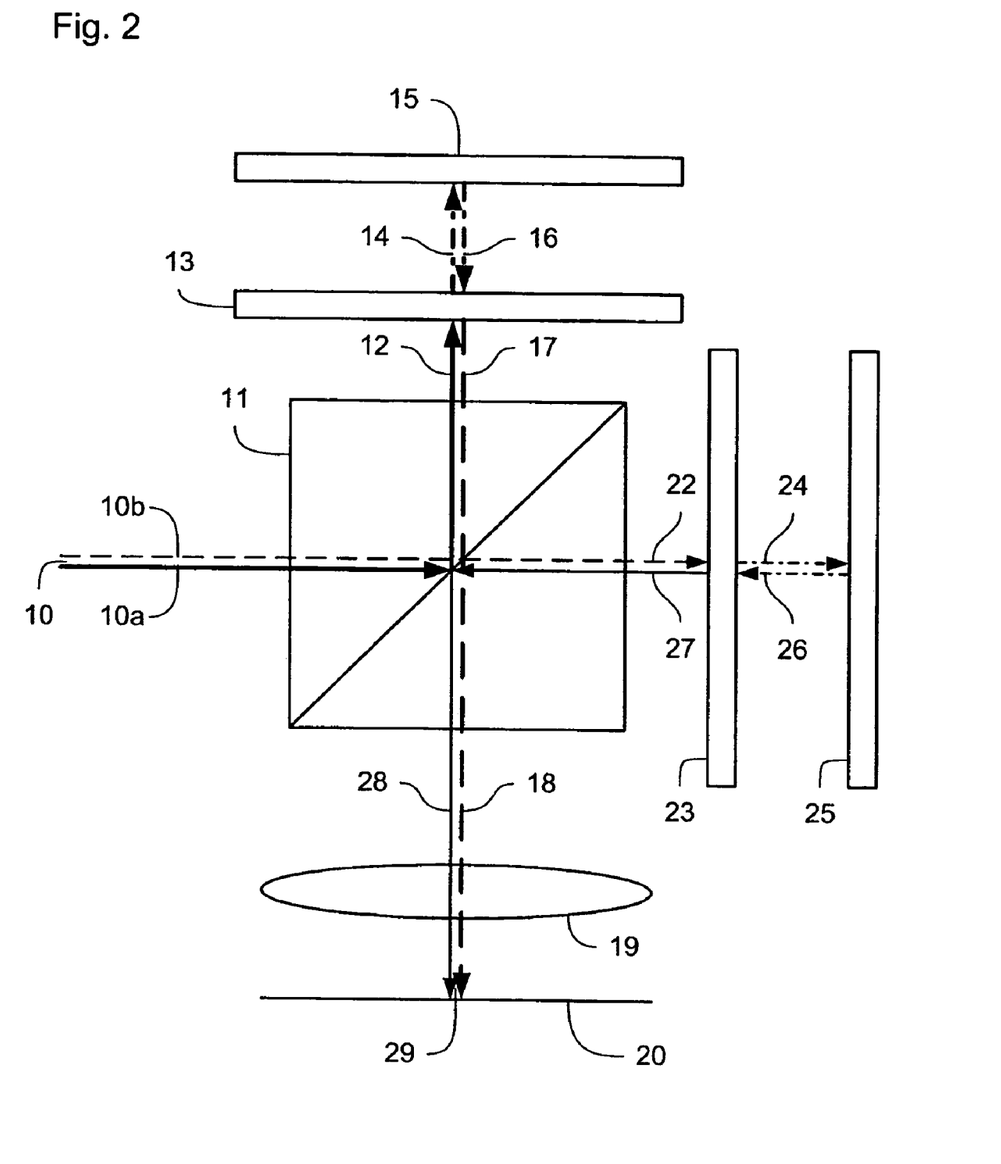
FIG. 2 depicts in detail an arrangement for patterning a radiation beam in a lithographic apparatus, according to one embodiment of the present invention.

FIG. 2 depicts in detail an arrangement for patterning a radiation beam in a lithographic apparatus, according to one embodiment of the present invention. A beam of radiation 10 provided by an illumination system 102 (e.g., illumination system 102) comprises a first portion 10a that is linearly polarized in a first direction and a second portion 10b that is linearly polarized in a direction orthogonal to that of first portion 10a. Radiation that is linearly polarized in a direction parallel to that of first portion 10a of projection beam of radiation 10 is shown in solid lines. Broken lines denote radiation that is plane polarized in a direction parallel to that of second portion 10b of projection beam of radiation 10. Radiation that is circularly polarized is denoted by chain lines. Furthermore, as will be explained in detail below, radiation following a first optical path is shown in relatively thicker lines and radiation following a second optical path is shown in relatively thin lines with relatively small arrows.

Projection beam of radiation 10 is directed into a beam splitter 11. In this embodiment, beam splitter 11 is a polarizing cube that reflects plane polarized radiation that is parallel to first portion 10a of projection beam of radiation 10 and transmits plane polarized radiation that is parallel to second portion 10b of projection beam of radiation 10. Therefore, first portion 10a of projection beam of radiation 10 is reflected from polarizing cube 11 as a first beam of radiation 12.

First beam of radiation 12 passes through a quarter wavelength plate 13, and consequently first beam of radiation 12 becomes a circularly polarized beam of radiation 14. Circularly polarized beam of radiation 14 is incident on a first array of individually controllable elements 15, which patterns beam of radiation 14 and reflects it back as a circularly polarized pattered beam of radiation 16. Circularly polarized patterned beam 16 subsequently passes through quarter wavelength plate 13 for a second time. Passing circularly polarized patterned beam of radiation 16 through quarter wavelength plate 13 again linearly polarizes beam of radiation 16 to produce a first linearly polarized pattern beam of radiation 17.

First patterned beam of radiation 17 is plane polarized in a direction orthogonal to first beam of radiation 12 (from which it is derived) because it has passed through quarter wavelength 13 twice. Therefore, when first patterned beam of radiation 17 is directed back into polarizing cube 11 it is transmitted through it to form a first part 18 of a combined patterned beam of radiation 29.

In a corresponding manner, second portion 10b of projection beam of radiation 10 is initially transmitted through polarizing cube 11 to form a second beam of radiation 22, which passes through a second quarter wavelength plate 23 to form a second circularly polarized beam of radiation 24. Second circularly polarized beam of radiation 24 is incident on a second array of individually controllable elements 25, which patterns circularly polarized beam of radiation 24, resulting in a second circularly polarized patterned beam of radiation 26. Second circularly polarized patterned beam of radiation 26 again passes through quarter wavelength plate 23 to form second linearly polarized patterned beam of radiation 27. Second linearly polarized patterned beam of radiation 27 is polarized in a direction orthogonal to first beam of radiation 22 because it has passed through second quarter wavelength plate 23 twice. Second linearly polarized patterned beam of radiation 27 is therefore polarized in the same direction as first portion 10a of projection beam of radiation 10. It is therefore reflected by polarizing cube 11 to form second portion 28 of combined patterned beam of radiation 29. Combined patterned beam of radiation 29 is subsequently projected onto the substrate 20 by a projection system 19.

It is to be appreciated that, although FIG. 2 shows beams of radiation, such as first and second part 10a, 10b of projection beam of radiation 10, adjacent to one another, this has merely done for the clarity of the Figure and in practice the beams may be coincident.

Using this patterning arrangement, it is possible to provide entirely independent patterns (using first and second arrays of the individually controllable elements 15, 25) to different parts of beam of radiation 10 provided by the illumination system. A pattern to be projected onto substrate 20 can be divided between two arrays of individually controllable elements 15, 25 according to their type. For example, first array of individually controllable elements 15 may be used to generate the pattern for all of the elongate pattern features that are aligned parallel to a first direction, while second array of individually controllable elements 25 may produce the pattern for all of the elongate pattern features aligned perpendicularly to the first direction. The illumination settings for each portion of the pattern may then be optimized for the features being produced.

In addition, in an example where a projection system that conserves the polarization of combined patterned beam 29 is used, then first and second portions 18, 28 of the combined patterned beam of radiation 29 can be projected onto substrate 20 linearly polarized in a direction that assists the imaging (see below).

It should be noted that although the arrangement above has been shown using a polarizing cube 11 as both a beam splitter and a beam combiner together with reflective arrays of individually controllable elements 15 and 25, alternative configurations could also be used. For example, first and second arrays of individually controllable elements could be transmissive and used in conjunction with a separate beam combiner before projection onto substrate 20.

Figure 5:
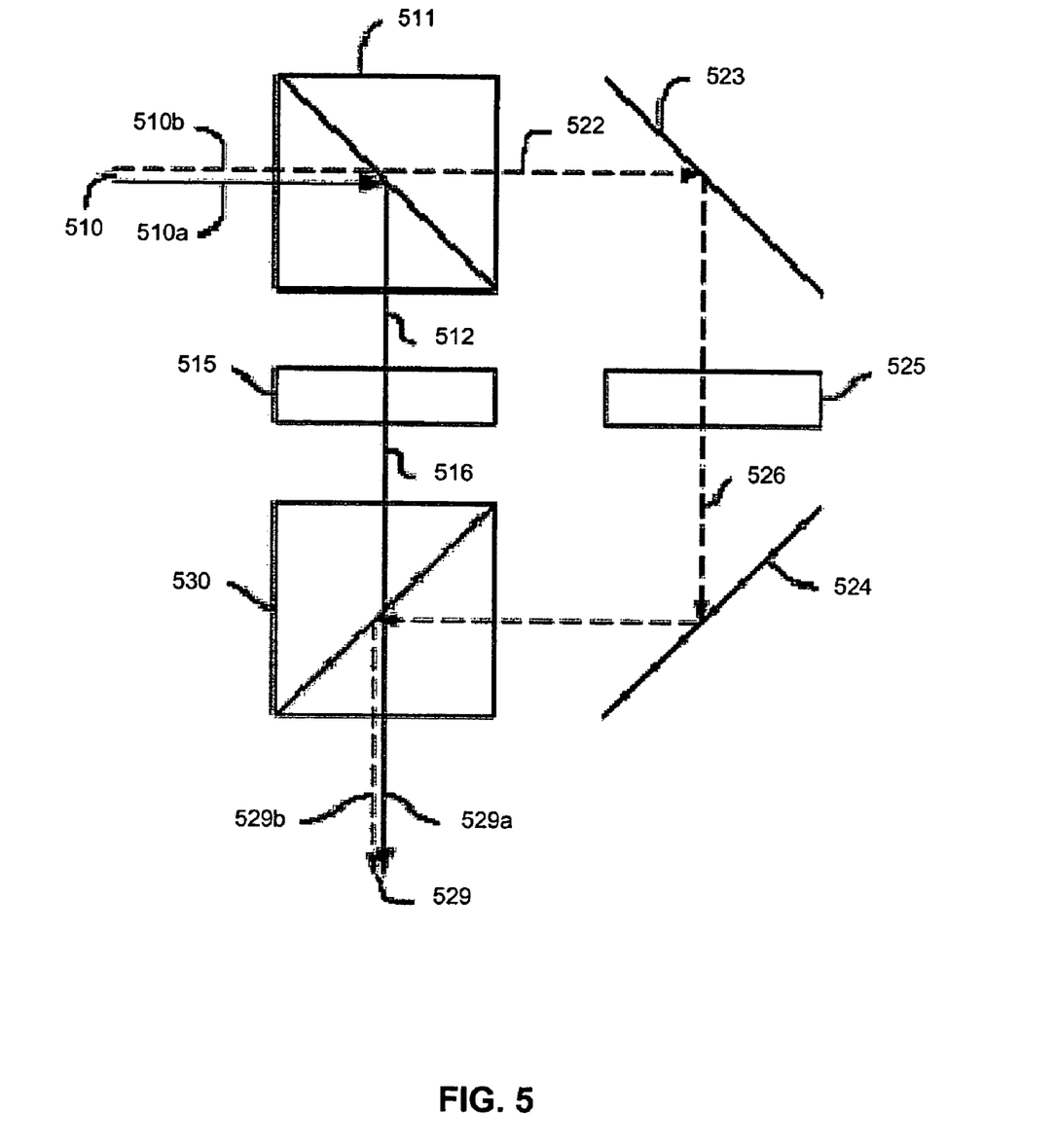
FIG. 5 depicts in detail an arrangement for patterning a radiation beam in a lithographic apparatus, according to one embodiment of the present invention.

FIG. 5 depicts in detail an arrangement for patterning a radiation beam in a lithographic apparatus, according to one embodiment of the present invention. A beam of radiation 510 provided by an illumination system (e.g., illumination system 102) comprises a first portion 510a that is linearly polarized in a first direction and a second portion 510b that is linearly polarized in a direction orthogonal to that of first portion 510a. Beam of radiation 510 is directed to a polarizing cube 511, which reflects plane polarized radiation that is parallel to first portion 510a of the projection beam of radiation and transmits plane polarized radiation that is parallel to second portion 510b of the projection beam of radiation 510. Therefore, first portion 510a of the projection beam of radiation 510 is reflected from polarizing cube 511 as a first beam of radiation 512 and second portion 510b is transmitted through polarizing cube 511 as a second beam of radiation 522.

First beam of radiation 512 passes through a transmissive array of individually controllable elements 515, which applies a first pattern to beam of radiation 512. This creates a first patterned beam of radiation 516, which is linearly polarized in the first direction.

Second beam of radiation 522 is directed by reflectors 523, 524 and passes through a second transmissive array of individually controllable elements 525, which imparts a second pattern to second beam of radiation 522, generating a second patterned beam of radiation 526.

First and second patterned beams of radiation 516, 526 are combined in a second polarizing cube 530. Second polarizing cube 530 acts in an opposite fashion as compared to first polarizing cube 511. Radiation that is linearly polarized in the first direction is transmitted through polarizing cube 530 and radiation that is linearly polarized in the second direction is reflected in polarizing cube 530. Therefore, first patterned beam of radiation 516 is transmitted through second polarizing cube 530 and second patterned beam of radiation 526 is reflected in second polarizing cube 530. First and second patterned beams of radiation 516, 526 are combined in polarizing cube 530 to form a combined patterned beam 529. Combined beam 529 is made up of (1) a first portion 529a that is radiation linearly polarized in the first direction and patterned according to a first pattern of transmissive array of individually controllable elements 515 and (2) a second portion 529b that is radiation linearly polarized in a second direction, orthogonal to the first direction, and patterned according to a second pattern of second transmissive array of individually controllable elements 525.

In another embodiment, reflective arrays of individually controllable elements could be illuminated non-telecentrically and a beam combiner separate from the beam splitter could be used. Furthermore, a non-polarizing beam splitter could be used. However, in this case, it would subsequently be necessary to use a polarizing filter to polarize the first and second portions of the projection beam of radiation or the first and second patterned beams of radiation to obtain the maximum benefit when the combined patterned beam is projected onto the substrate. A combination of such arrangements may also be used.

Figure 3:
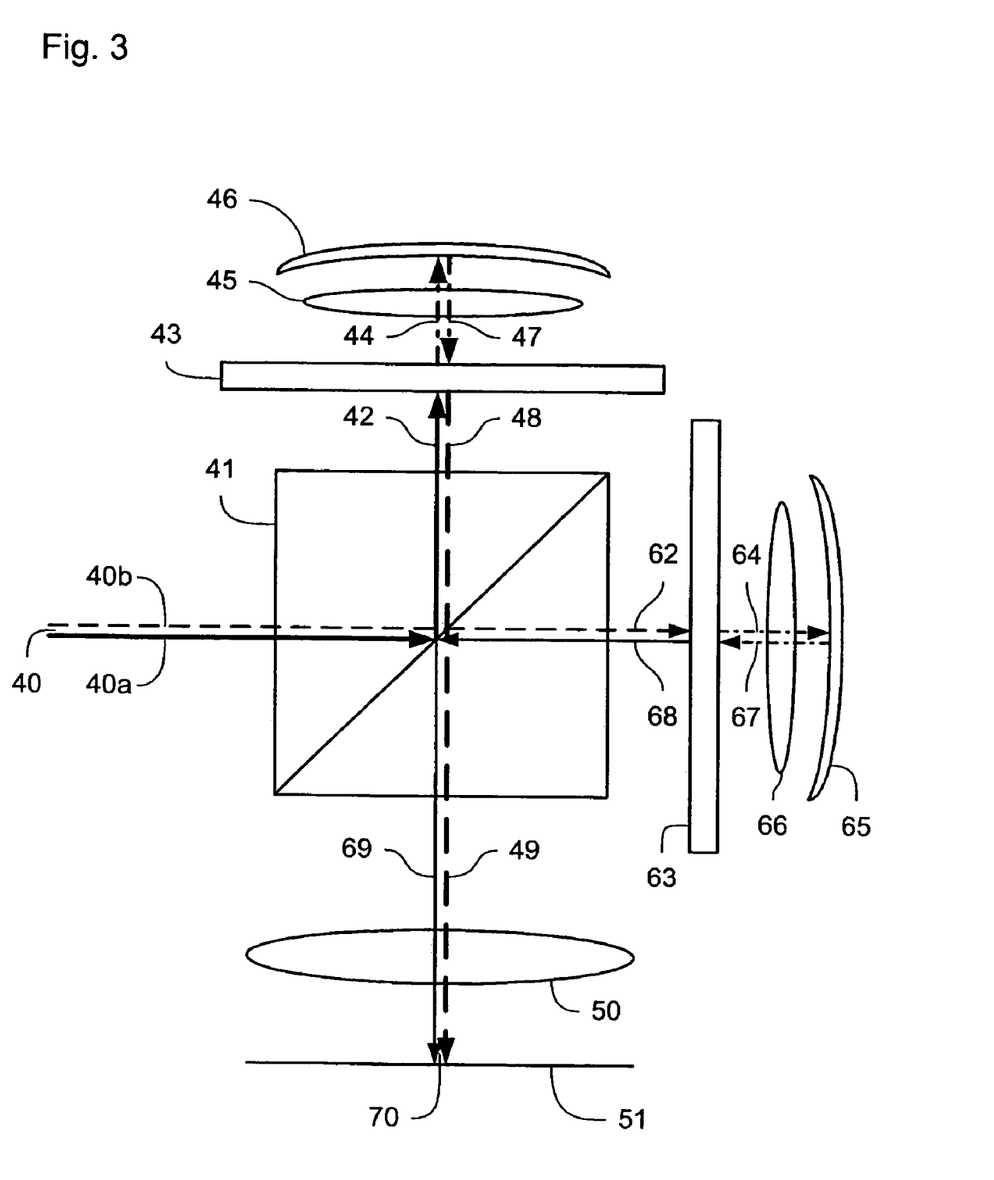
FIG. 3 depicts a projection system, according to one embodiment of the present invention.

FIG. 3 depicts a projection system, according to one embodiment of the present invention. The two parts of the patterned beam of radiation with different polarizations may then have entirely different patterns and have followed different optical paths. It is therefore desirable to be able to make any necessary corrections to the beam of radiation independently for the two parts. FIG. 3 depicts an arrangement for making such corrections. The configuration is similar to the patterning arrangement shown in FIG. 2 and a corresponding line convention for depicting optical paths and differing polarizations is used.

In the embodiment shown in FIG. 3, a patterned beam of radiation 40 has a first part 40a, which is linearly polarized in a first direction, and a second part 40b, which is linearly polarized in an orthogonal direction. Patterned beam of radiation 40 is directed into a polarizing cube 41, which reflects first part 40a of patterned beam of radiation 40 to form a first beam of radiation 42 and transmits second part 40b of patterned beam 40 through polarizing cube 41 to form a second beam of radiation 62.

First beam of radiation 42 passes through a quarter wavelength plate 43 to form a circularly polarized beam of radiation 44. Circularly polarized beam 44 is subsequently corrected, as required. Circularly polarized beam of radiation 44 passes through a first lens system 45 and is then reflected by a concave mirror 46. In one example, appropriate selection of concave mirror 46 and lens system 45 enables correction of any chromatic errors, such as chromatic aberration. In one example, a Mangin group may be used. A corrected circularly polarized beam of radiation 47 subsequently passes through quarter wavelength plate 43 for a second time to form a first portion 49 of the corrected patterned beam of radiation 70, which is projected onto substrate 51 by an objective lens system 50.

Second beam of radiation 62 is transmitted through polarizing cube 41, corresponding to second portion 40b of patterned beam of radiation 40, passes through a second quarter wavelength plate 63, producing a circularly polarized beam of radiation 64. Circularly polarized beam of radiation 64 passes through a second lens system 66 and is reflected by a second concave mirror 65, which has an appropriate shape to produce a second circularly polarized corrected beam 67. Second circularly polarized corrected beam of radiation 67 passes through quarter wavelength plate 63 for a second time to produce a corrected beam of radiation 68, which is linearly polarized in a direction orthogonal to second portion of 40b of an uncorrected patterned beam of radiation 40. Corrected beam of radiation 68 is reflected in polarizing cube 41 to produce a second corrected portion 69 of patterned beam of radiation 70, which is projected onto substrate 51 together with first corrected portion 49 by objective lens system 50. Therefore, separate, independent, corrections may be applied to orthogonally polarized portions 40a and 40b of the patterned beam of radiation 40.

In one example, the illumination system is arranged to provide full polarization control of projection beam of radiation 10 that is directed into the patterning arrangement, such as is shown in FIG. 2. In particular, the illumination system is arranged to maintain the polarization of the radiation in an integrator.

Exemplary Illumination Fields in a Pupil Plane

Figure 4A:
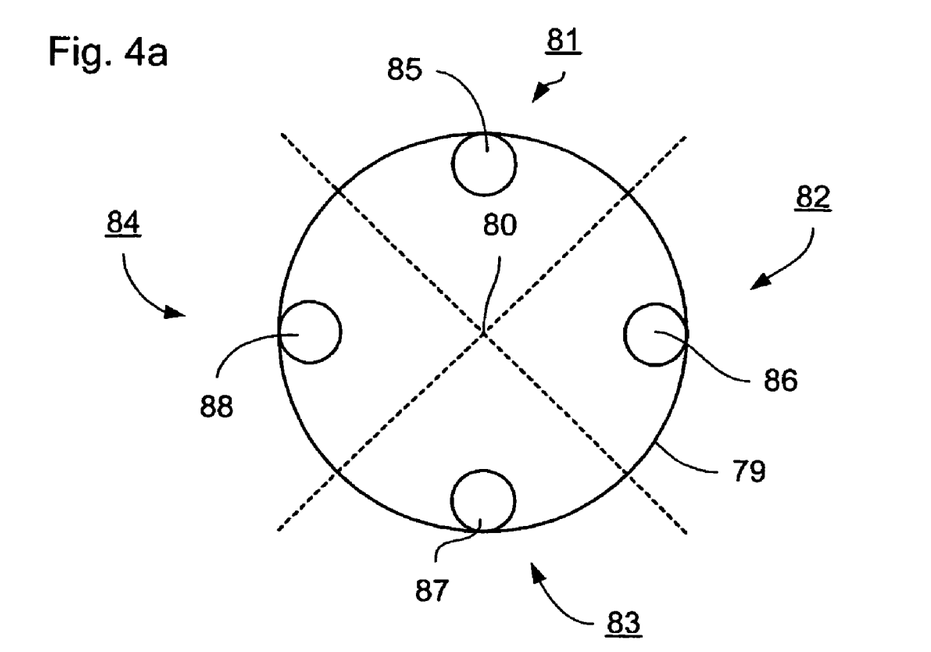
FIGS. 4a and 4b depict examples of illumination fields in a pupil plane of a lithographic apparatus, according to various embodiments of the present invention.

FIG. 4a depicts an illumination scheme, according to one embodiment of the present invention. In this embodiment, illumination fields in a pupil plane 79 are shown. Pupil plane 79 is divided into four quadrants 81,82,83,84. In the first example, shown in FIG. 4a, the radiation in each quadrant of pupil plane 79 is localized in an area 85,86,87,88 that is arranged away from optical axis 80. The radiation in opposite quadrants, namely in the quadrants denoted 81 and 83 or 82 and 84, is linearly polarized in the same direction, but orthogonally to the radiation in the other two quadrants. Therefore, using such an illumination field, and the patterning arrangement such as shown in FIG. 2, each of the two arrays of individually controllable elements 15, 25 are illuminated with a dipole illumination mode and the patterned features generated on each of the arrays of individually controllable elements may be those appropriate for the dipole illumination.

Figure 4B:
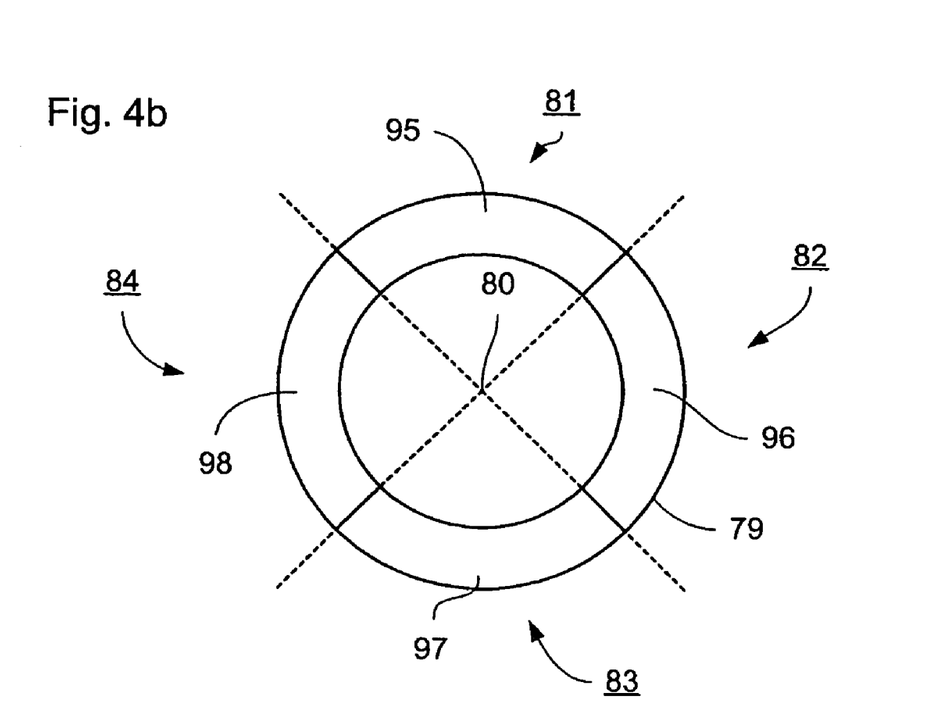

FIG. 4b depicts an alternative illumination scheme, according to one embodiment of the present invention. In this embodiment, an annular illumination mode is used. However, as in the example shown in FIG. 4a, the linear polarization in the radiation in opposite quadrants is the same, but orthogonal to that in the adjacent quadrants. For example, the radiation in sections 95 and 97 in the quadrants of pupil plane 79 that are denoted 81 and 83 are linearly polarized in the same direction as each other. Likewise, the radiation in sections 96 and 98 in the quadrants denoted 82 and 84 are linearly polarized in the same direction as each other, but orthogonal to that of the radiation in sections 95 and 97. It will be appreciated that variants of the illumination modes described or entirely different illumination modes may also be beneficial in appropriate circumstances.

The illumination modes as described may be generated using, for example, a Schuster Platte (i.e., a plate with segments for polarizing the light tangentially, perpendicular to the radius of the pupil).

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a beam of radiation;
   a beam splitter that splits the beam into a first beam and a second beam;
   a first array of individually controllable elements that patterns the first beam with a first pattern;
   a second array of individually controllable elements that patterns the second beam with a second pattern;
   first and second quarter wave plates located between the beam splitter and respective ones of the first and second arrays of individually controllable elements that change a polarization of respective ones of the first and second beams;
   a beam combiner that combines the first and second patterned beams to form a combined patterned beam; and
   a system that projects the combined patterned beam onto a target portion of a substrate,
   wherein a first portion of the combined patterned beam derived from the first patterned beam is substantially linearly polarized, and
   wherein a second portion of the combined patterned beam derived from the second patterned beam is substantially linearly polarized, substantially orthogonal to the first portion.

2. The lithographic apparatus of claim 1, wherein:
   the first and second portions of the combined patterned beam are projected onto the substrate at respective oblique angles; and
   an illumination field of at least one of the first and second portions of the combined patterned beam of radiation substantially lies in a plane that is perpendicular to a plane that is defined by a line along which the respective beam of radiation is projected onto the substrate and a line perpendicular to the substrate.

3. The lithographic apparatus of claim 1, wherein a single optical element is used as both the beam splitter and the beam combiner.

4. The lithographic apparatus of claim 1, wherein:
   the beam splitter is a polarizing cube;
   said first beam of radiation being derived from radiation in the beam of radiation that is linearly polarized in a first direction; and
   said second beam of radiation being derived from radiation in the beam of radiation that is linearly polarized in a second direction that is orthogonal to the first direction.

5. The lithographic apparatus of claim 1, further comprising:
   a correction system that provides independent correction of chromatic errors in each of the first and second portions of the combined patterned beam.

6. The lithographic apparatus of claim 1, wherein the beam of radiation from the illumination system comprises:
   radiation in a first portion of a pupil plane that is substantially linearly polarized; and
   radiation in a second portion of the pupil plane that is substantially linearly polarized and substantially orthogonal to the radiation in the first portion of the pupil plane.

7. The lithographic apparatus according to claim 1, wherein the beam of radiation from the illumination system comprises:
   radiation in opposite quadrants of an illumination field in a pupil plane that is substantially linearly polarized in substantially parallel directions; and
   radiation in adjacent quadrants of the illumination field in the pupil plane that is substantially linearly polarized in substantially orthogonal directions.

8. The lithographic apparatus of claim 1, wherein the first and second quarter wave plates are configured to:
   circularly polarize the first and second beams, respectively, between the respective first and second quarter wave plates and the respective arrays of individually controllable elements; and
   linearly polarize the first and second beams between the respective first and second quarter wave plates and the beam splitter.

9. A lithographic apparatus, comprising:
   an illumination system that supplies a beam of radiation;
   a patterning device that patterns the beam;
   a system that projects the patterned beam onto a target portion of a substrate, the system comprises
      a polarizing cube that separates the patterned beam into a first patterned sub-beam having radiation that is substantially linearly polarized in a first direction and second patterned sub-beam having radiation that is substantially linearly polarized in a second direction, which is substantially orthogonal to the first direction;
      first and second optical correction units that correct the first and second patterned sub-beams, respectively; and
      a beam combiner that combines the first and second corrected sub-beams to form a corrected patterned beam.

10. The lithographic apparatus of claim 9, wherein:
    the beam combiner is the polarizing cube; and
    the optical correction units return the corrected sub-beams along a reverse of an optical path of the patterned sub-beams.

11. The lithographic apparatus of claim 10, further comprising:
    a first quarter wavelength plate positioned in an optical path of the first patterned sub-beam and the first corrected sub-beam between the polarizing cube and the first optical correction unit; and
    a second quarter wavelength plate positioned in the optical path of the second patterned beam and the second corrected sub-beam between the polarizing cube and the second optical correction unit.

12. A device manufacturing method, comprising:
    (a) splitting a beam of radiation into first and second linearly polarized beams of radiation using a beam splitter;
    (b) changing a polarization of each of the first and second beams from linearly polarized to circularly polarized;
    (c) patterning the first beam of radiation with a first pattern using a first array of individually controllable elements;

(d) patterning the second beam of radiation with a second pattern using a second array of individually controllable elements;
(e) changing a polarization of each of the first and second patterned beams from circularly polarized to linearly polarized;
(f) combining the first and second patterned beams to form a combined patterned beam using a beam combiner; and
(g) projecting the combined patterned beam of radiation onto a target portion of a substrate,
wherein a first portion of the combined patterned beam derived from the first patterned beam is substantially linearly polarized,
wherein a second portion of the combined patterned beam derived from the second patterned beam is substantially linearly polarized, substantially orthogonal to the first portion.

13. A device manufacturing method, comprising:
(a) patterning a beam of radiation using a patterning device;
(b) separating the patterned beam into a first patterned sub-beam having radiation that is substantially linearly polarized in a first direction using a polarized cube;
(c) separating the patterned beam into a second patterned sub-beam having radiation that is substantially linearly polarized in a second direction, substantially orthogonal to the first direction using the polarized cube;
(d) correcting each of the first and second patterned sub-beams using respective first and second optical correction units; and
(e) combining the first and second corrected sub-beams to form a corrected patterned beam; and
(f) projecting the corrected patterned beam onto a target portion of a substrate.

14. A device manufacturing method, comprising:
splitting a beam of radiation into first and second beams;
directing the first beam through a first patterning device to impart a first pattern on the first beam;
directing the second beam through a second patterning device to impart a second pattern on the second beam;
combining the first and second patterned beams to form a combined patterned beam, a first portion of the combined patterned beam derived from the first patterned beam being substantially linearly polarized and a second portion of the combined patterned beam derived from the second patterned beam being substantially linearly polarized and substantially orthogonal to the first portion; and
projecting the combined patterned beam onto a target portion of a substrate.

* * * * *